(12) United States Patent
Blair et al.

(10) Patent No.: US 6,573,796 B2
(45) Date of Patent: Jun. 3, 2003

(54) AUTOMATIC LDMOS BIASING WITH LONG TERM HOT CARRIER COMPENSATION

(75) Inventors: Cynthia Blair, Morgan Hill, CA (US); Robert Bartola, Pottstown, PA (US); Nagaraj V. Dixit, Gilbert, AZ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/962,975

(22) Filed: Sep. 24, 2001

(65) Prior Publication Data

US 2003/0058051 A1 Mar. 27, 2003

(51) Int. Cl.[7] ................................................ H03F 3/04
(52) U.S. Cl. .................... 330/296; 330/289; 330/290
(58) Field of Search .................. 330/289, 290, 330/296

(56) References Cited

U.S. PATENT DOCUMENTS

| | | | | |
|---|---|---|---|---|
| 4,599,577 A | * | 7/1986 | Nollet | 330/290 |
| 5,777,518 A | * | 7/1998 | Bailey | 330/296 |
| 6,265,943 B1 | * | 7/2001 | Dening et al. | 330/296 |
| 6,335,657 B1 | * | 1/2002 | Hayase et al. | 327/560 |
| 6,351,189 B1 | * | 2/2002 | Hirvilampi | 330/296 |

* cited by examiner

Primary Examiner—Henry Choe
(74) Attorney, Agent, or Firm—Baker Botts L.L.P.

(57) ABSTRACT

Disclosed are systems and methods for automatic biasing of LDMOS devices at turn-on. The invention provides bias point setting with compensation for hot carrier effects each time the LDMOS device is turned on and also provides temperature compensation during operation of the device. The systems and methods of the invention are scalable such that a plurality of LDMOS devices may simultaneously have their bias points set, and temperature compensation provided.

18 Claims, 6 Drawing Sheets

AUTOMATIC LDMOS BIASING WITH LONG TERM HOT CARRIER COMPENSATION

TECHNICAL FIELD

The invention relates in general to systems and methods for automatic biasing of LDMOS devices. More particularly the invention relates to providing systems and methods for automatic biasing of LDMOS power transistors that can compensate for hot carrier effects and temperature changes. The systems and methods can be readily scaled to simultaneously set the bias points of multiple LDMOS devices.

BACKGROUND OF THE INVENTION

Laterally Diffused Metal-Oxide Semiconductor (LDMOS) devices are known in the arts. Over the past few years, LDMOS radio frequency (RF) power transistors have become widely used in high frequency applications such as for example, mobile telecommunications base stations. These devices are quite linear when properly biased. Typically, such devices are run in a "Class AB" mode. This mode of operation requires the setting of the gate voltage, or bias, for each device for the desired quiescent drain current. In some cases, biasing is accomplished with a simple potentiometer and in some cases with more sophisticated arrangements which also attempt to compensate for temperature and/or hot electron or hot carrier effects. Some combination of burn-in, laser trimming, trimming by potentiometer or external computer, and chip selection, are generally used to set the bias points, or compensate for expected inaccuracies in the bias points, of LDMOS devices.

There are several problems commonly encountered with current biasing techniques. The known techniques suffer from serious shortcomings including being time consuming and expensive. Generally, known techniques must be performed on each LDMOS device individually, due to the complexities of trying to perform such procedures on multiple devices automatically. Due to the changes inherent in LDMOS devices over time, the appropriateness of fixed bias points set by conventional techniques degrade overtime. For example, burn-in is often used. Burn-in is a technique wherein the LDMOS device is operated for a time at the factory and then the bias point is permanently set. Since the most dramatic changes in the bias point occur early in the life cycle of a LDMOS device, this method avoids the most dramatic changes in the device characteristics, and then sets a fixed bias point. A serious shortcoming with this technique is caused by the fact that the device characteristics continue to change. Thus, the fixed bias point becomes less matched to the actual device as it is used.

The problem of fixed bias points degrading overtime is largely caused by a phenomenon known as hot-carrier effect. Hot-carrier effect occurs in all MOS transistor devices. In the vicinity of the drain under operational conditions, carriers periodically obtain a sufficient amount of energy to break free from the silicon/silicon dioxide surface barrier and enter the oxide. Neutral centers in the oxide trap some of the injected charge causing a charge build-up. This charge build-up is cumulative, and can result in significant changes to the operating characteristics of the device over time resulting in a curtailment of the useful life of the device.

Temperature effects are another problem encountered in the art for the simple reason that the electrical characteristics of the device can change with changes in temperature. This results in changes in the optimal bias point as the device is heated or cooled. Temperature effects are transient in nature, which presents difficulties with selecting a fixed bias point.

Due to the above and additional problems in the LDMOS biasing art, improved methods and systems for automatically adjusting the bias point of LDMOS devices would provide significant advantages in terms of precision, increased device life, reduced manufacturing costs, and increased efficiency in terms of time and complexity when setting bias points for multiple devices. Methods and systems for resetting an LDMOS device bias point at turn-on would largely compensate for hot-carrier effects.

SUMMARY OF THE INVENTION

In general, the invention provides systems and methods for setting the bias point of an LDMOS device. The systems and methods provide automatic adjustment of the bias point of an LDMOS device according to changes in device characteristics.

A disclosed method for setting the bias point of an LDMOS device includes steps for sensing the current draw of an LDMOS device and comparing the current draw of the LDMOS device to a reference. A step of responsively applying a voltage to the gate of the LDMOS device is provided in order to at least partially offset any difference detected in the comparison. The above steps are repeated until the LDMOS device gate voltage remains a substantially constant value, and the bias point is set.

According to another aspect of the invention, an LDMOS device bias point is set each time power is cycled to the LDMOS device.

According to yet another aspect of the invention, continuous temperature correction is provided to the LDMOS device bias point.

According to still another aspect of the invention, a system for setting the bias point of an LDMOS device includes a current sensor to sense the current draw of the LDMOS device. A comparator is provided for comparing the current draw of the LDMOS device to a reference. A digital potentiometer is used for incrementing the gate bias of the LDMOS device in response to the comparator output, and a mechanism is provided for storing the bias point setting of the LDMOS device.

According to another aspect of the invention, the system also includes circuitry for compensating the bias point responsive to temperature changes.

Numerous technical advantages are provided by the invention including increased bias point accuracy, hot carrier and temperature compensation, scalability enabling automatic biasing of multiple LDMOS devices, reduced cost, increased efficiency, and increased useful life of LDMOS devices.

BRIEF DESCRIPTION OF THE DRAWINGS

The above advantages, as well as specific embodiments of the present invention, will be more clearly understood from consideration of the following descriptions in connection with accompanying drawings in which.

Corresponding numerals and symbols in the various figures refer to corresponding parts unless otherwise indicated. The figures are not to scale and some features of embodiments shown and discussed are simplified or exaggerated for illustrating the principles of the invention.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. It should be understood that the invention may be practiced with LDMOS devices of various types and in various configurations.

Figure 1:
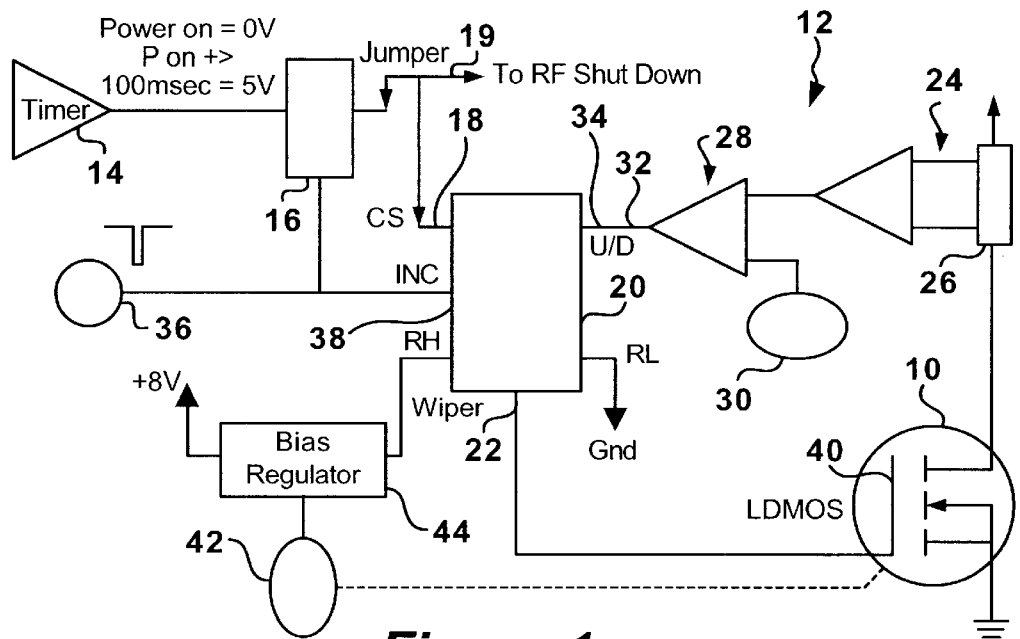
FIG. 1 is a block diagram of an example of the system and method of the invention.

With reference primarily to FIG. 1, an LDMOS device 10 (not part of the invention) is electrically connected to the biasing circuit 12 as shown. At turn-on a timer 14 starts. A flip-flop 16 is reset providing a signal to the chip select pin 18 of a digital potentiometer 20 and the digital potentiometer 20 is enabled. The RF drive of the LDMOS device 10 is inhibited during biasing. A current sensing circuit 24 is electrically connected to sense the current draw of the LDMOS device 10, preferably through an approximately 0.1 Ohm sensing resistor 26.

The sensed LDMOS current draw (now converted to a voltage) is fed to a comparison circuit 28. The comparison circuit 28 compares the LDMOS current draw against a quiescent current reference voltage from a reference circuit 30, preferably provided by a voltage divider (1V=1A). When the comparison circuit 28 reveals that the LDMOS current is lower than the current of the reference circuit 30, a logical high is produced at the comparison output 32. Conversely, when the comparison circuit 28 reveals that the LDMOS current is higher than the current of the reference circuit 30, a logical low is produced at the comparison output 32. The wiper, up or down, of the potentiometer 20 is set, at up/down pin 34, according to the high or low output 32 of the comparison circuit 28. Of course, the high/low or up/down logic may be inverted without altering the principles of the invention.

On the next clock 36 pulse, the wiper 22 of the digital potentiometer 20, is incremented, at increment pin 38, one step. The resulting voltage on the wiper 22 is then fed to the gate 40 of the LDMOS device 10. The increase or decrease in gate 40 bias causes the LDMOS device 10 to conduct either more or less. The loop from the current sensing circuit 24 to the gate 40 continues to function as described above, resulting in further changes to the gate 40 bias until equilibrium is reached between the desired quiescent current set by the reference circuit 30 and the actual quiescent current drawn by the LDMOS device 10. It should be understood that during the iterations of this process, the LDMOS device 10 operates in a "Class A" closed loop mode.

With continued reference primarily to FIG. 1, upon expiration of the timer 14, a high is sent to the flip-flop 16, and at the next high clock 36 period, the active low is removed from the chip select pin 18 of the digital potentiometer 20. The digital potentiometer 20 then preferably writes its present wiper 22 position to non-volatile memory, either internal or external to the potentiometer 20, and the RF drive is allowed to come on. Once the wiper 22 position is fixed, the LDMOS device 10 operates in an open loop "Class AB" mode.

While the LDMOS device 10 runs in "Class AB" mode, a thermal reference 42 is preferably tied to a bias regulator 44 for providing temperature compensation to the gate 40 bias. The thermal reference 42 should be thermally linked to the LDMOS device 10.

It should be apparent to those skilled in the arts that the biasing circuit 12 may be scaled to operate on numerous LDMOS devices 10 in unison. In principle, a single timer 14, flip-flop 16, clock 36, and bias regulator 44, may be used in a biasing circuit 12 adapted to automatically set the bias points of an infinite number of LDMOS devices, so long as individual comparison circuits 28, reference circuits 30 and potentiometers 20, are provided for each LDMOS device.

FIGS. 2–10 are provided to illustrate examples of the configuration of the circuit components depicted in the block diagram of FIG. 1. It should be understood that the preferred embodiments shown and described may be implemented in many alternative forms, by changing component values or placement, for example, without departure from the principles of the invention.

Figure 2:
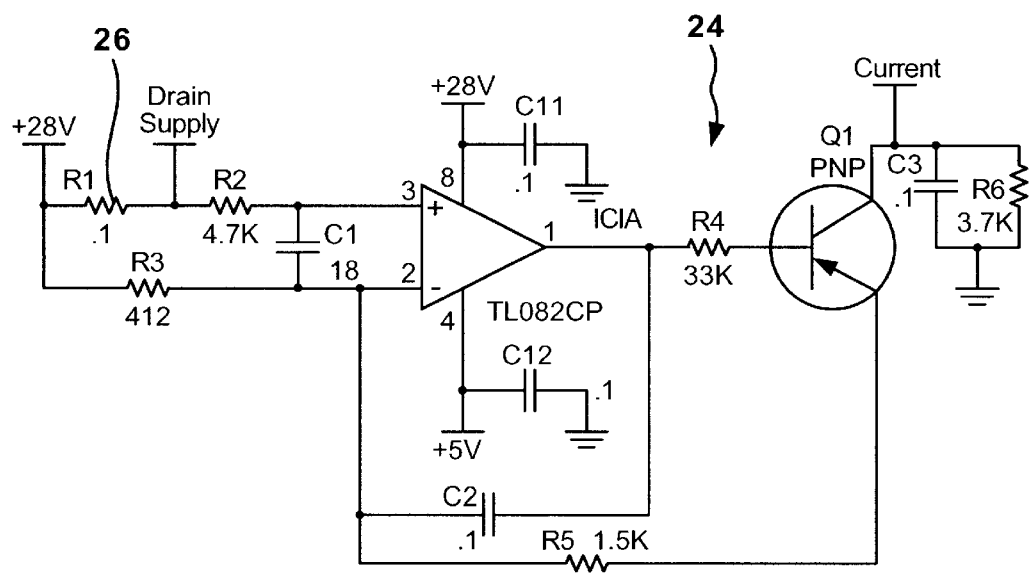
FIG. 2 is a schematic diagram of an example of the current sensing circuit of FIG. 1.

FIG. 2 depicts a schematic view of an example of a current sensing circuit 24 represented in the biasing circuit 12 of FIG. 1. The current sensing circuit 24 is preferably a current mirror familiar in the arts. The sensing resistor 26 is preferably a 0.1 Ohm resistor capable of sustaining approximately 2W. The transistor Q1 is a general purpose PNP device. It is preferred to implement this section with a current sense IC, although the sensing resistor 26 and R6 should be external.

Figure 3:
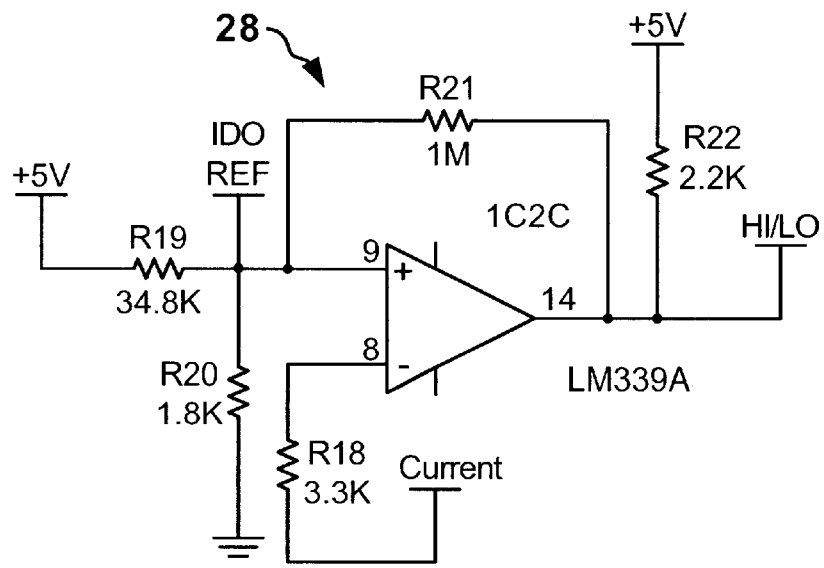
FIG. 3 is a schematic diagram of an example of the comparing circuit of FIG. 1.

FIG. 3 is a schematic diagram of an example of the comparison circuit 28 of FIG. 1. The comparison circuit 28 is preferably a comparator known in the arts.

Figure 4:
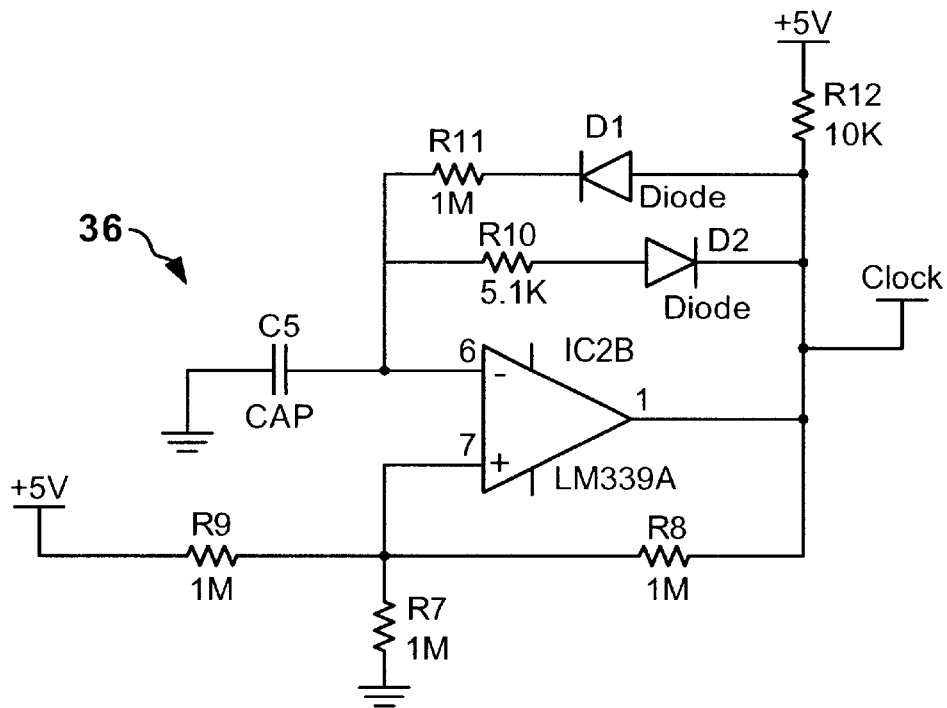
FIG. 4 is a schematic diagram showing an example of the clock circuit of FIG. 1.

FIG. 4 is a schematic diagram showing an example of the clock 36 of FIG. 1. The clock 36 is a common comparator circuit, although other configurations may be used as long as a clock signal is provided.

Figure 5:
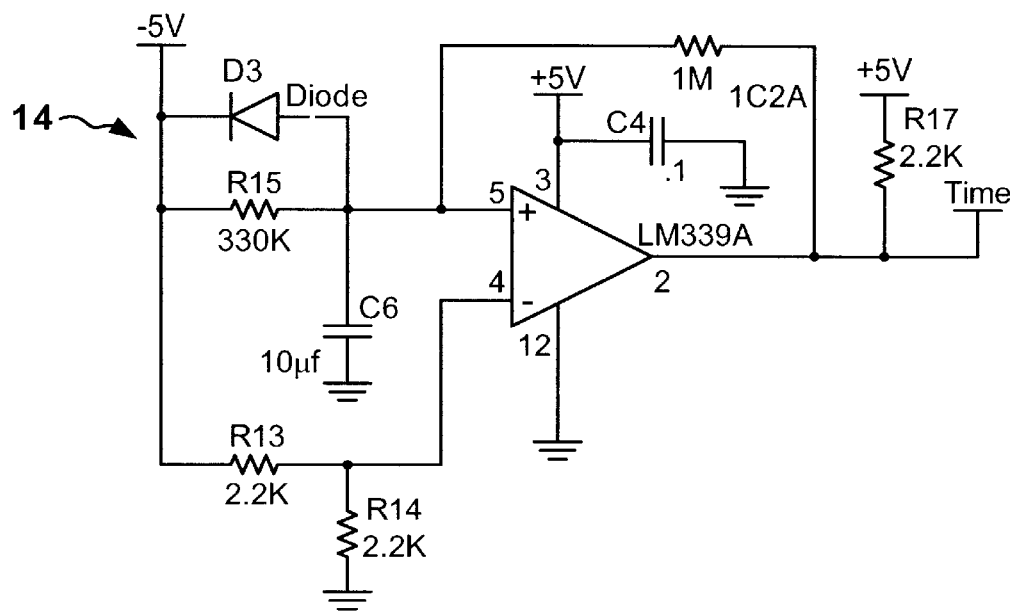
FIG. 5 is a schematic diagram showing an example of the timer circuit of FIG. 1.

FIG. 5 is a schematic diagram showing an example of the timer 14 of FIG. 1. Timer 14 of FIG. 5 will be recognized as a comparator circuit. As with the clock, other configurations of timer may be used as long as the signal is provided.

Figure 6:
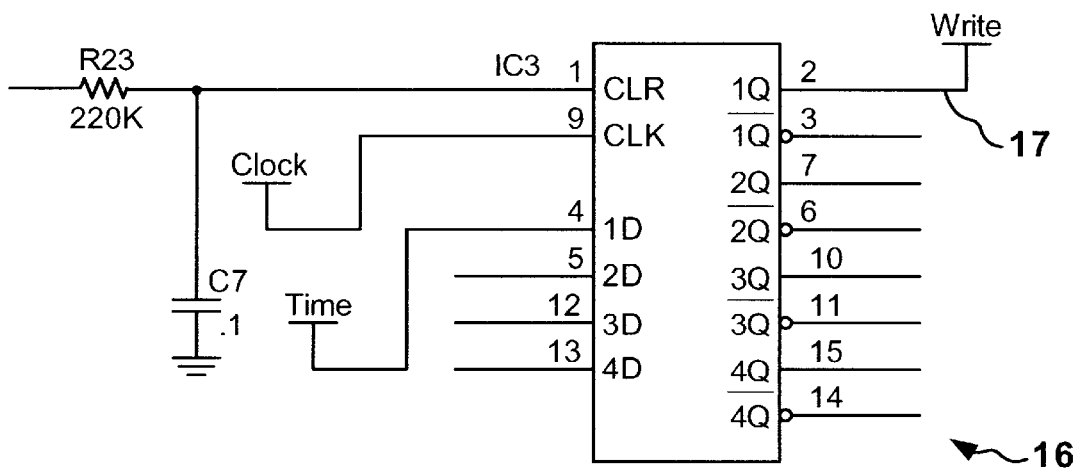
FIG. 6 is a schematic diagram showing an example of the flip-flop circuit of FIG. 1.

Shown in FIG. 6 is a schematic diagram of an example flip-flop 16 of FIG. 1. A standard flip-flop 16 known in the arts may be used in any configuration so long as the "Q" or not "Q" 17 is connectable to the enable jumper 19 or directly to the chip select pin of the digital pot of the biasing circuit 12.

Figure 7:
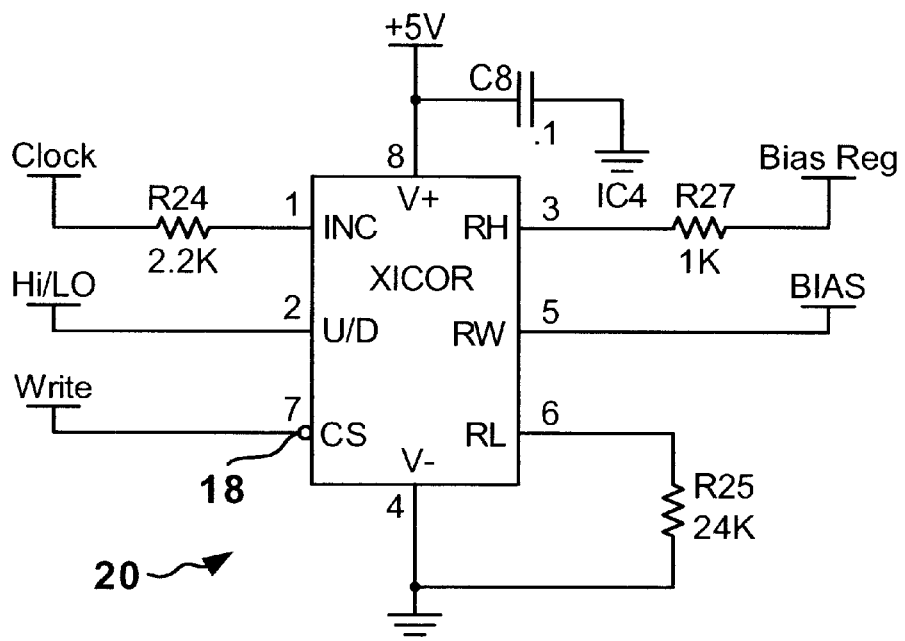
FIG. 7 is a schematic-diagram showing an example of a digital potentiometer circuit of FIG. 1.

FIG. 7 is a schematic diagram showing an example of a digital potentiometer 20 of FIG. 1. Many digital potentiometers are known in the arts. It is preferred that digital potentiometer 20 has internal non-volatile memory for storing the bias setting. The digital potentiometer 20 has the capability of storing a wiper position for a bias point wiper position. Resistor R27 is provided external to the digital potentiometer 20 for connection to the bias regulator 44 of the circuit 12 of FIG. 1. The chip select pin 18 is connected to the jumper 19 of the circuit 12. In implementations of the invention using multiple digital potentiometers 20 for biasing multiple LDMOS devices 10 (FIG. 1), the chip select pins 18 may all be connected together.

Figure 8:
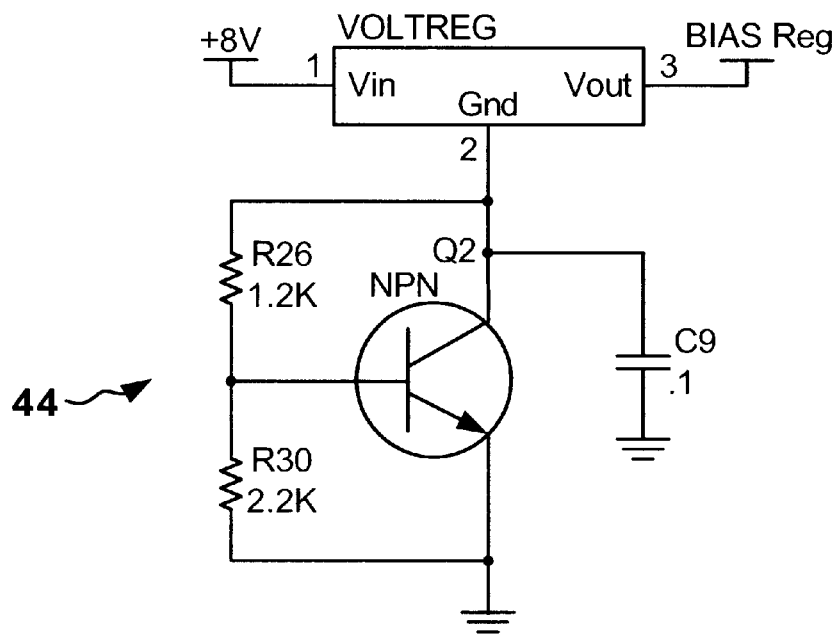
FIG. 8 is a schematic diagram showing an example of the temperature compensation circuit of FIG. 1.

FIG. 8 is a schematic diagram showing an example of the bias regulator 44 of the temperature compensation portion of the circuit 12 of FIG. 1. The transistor Q2 is a general purpose NPN device.

Figure 9:
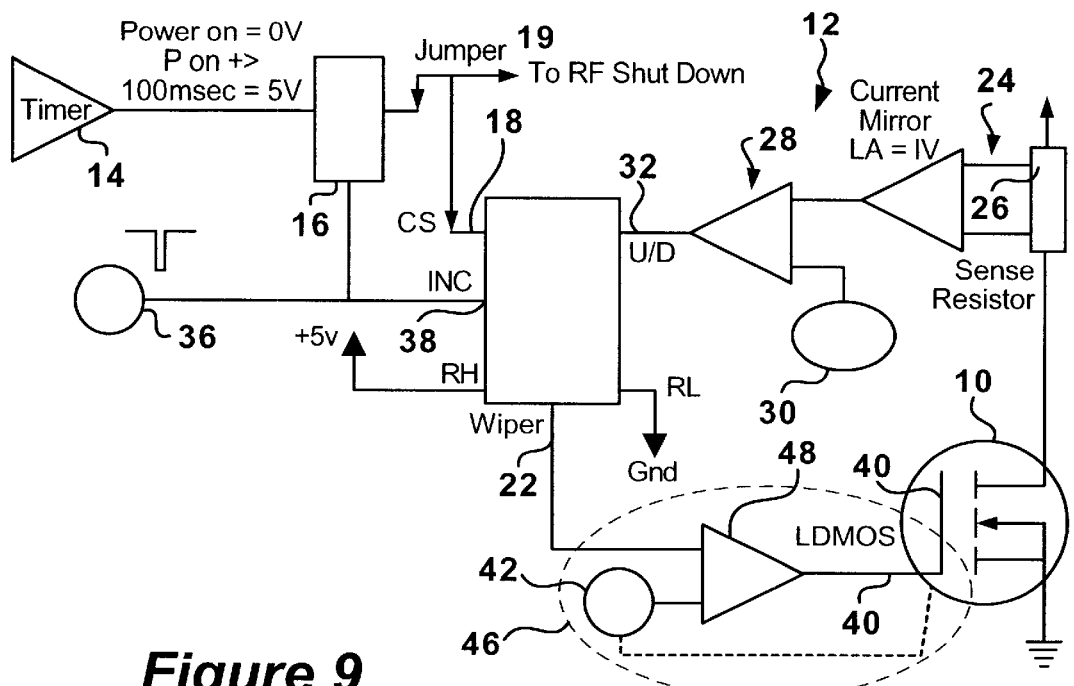
FIG. 9 is a block diagram showing an alternative example of the system and method of the invention.

FIG. 9 is a block diagram showing an LDMOS biasing circuit 12 with an example of an alternative configuration 46 for providing bias point temperature compensation. Of course, the thermal reference 42 should be thermally linked to the LDMOS device 10.

Figure 10:
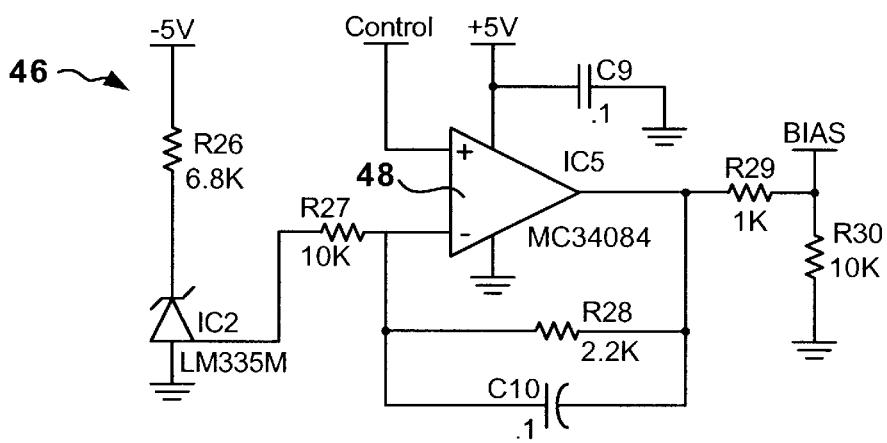
FIG. 10 is a schematic diagram illustrating an example of an alternative temperature compensation circuit of FIG. 9.

FIG. 10 is a schematic diagram showing an example of alternative temperature compensation circuit 46 of FIG. 9. A thermal reference 42 and the wiper 22 are coupled to the inputs of an inverting op amp 48 with its output connected to the LDMOS gate 40. Temperature compensation circuit 46 may be designed with standard components. If multiple LDMOS devices 10 are biased simultaneously, a single diode LM335 may be used as a reference for all.

Figure 11:
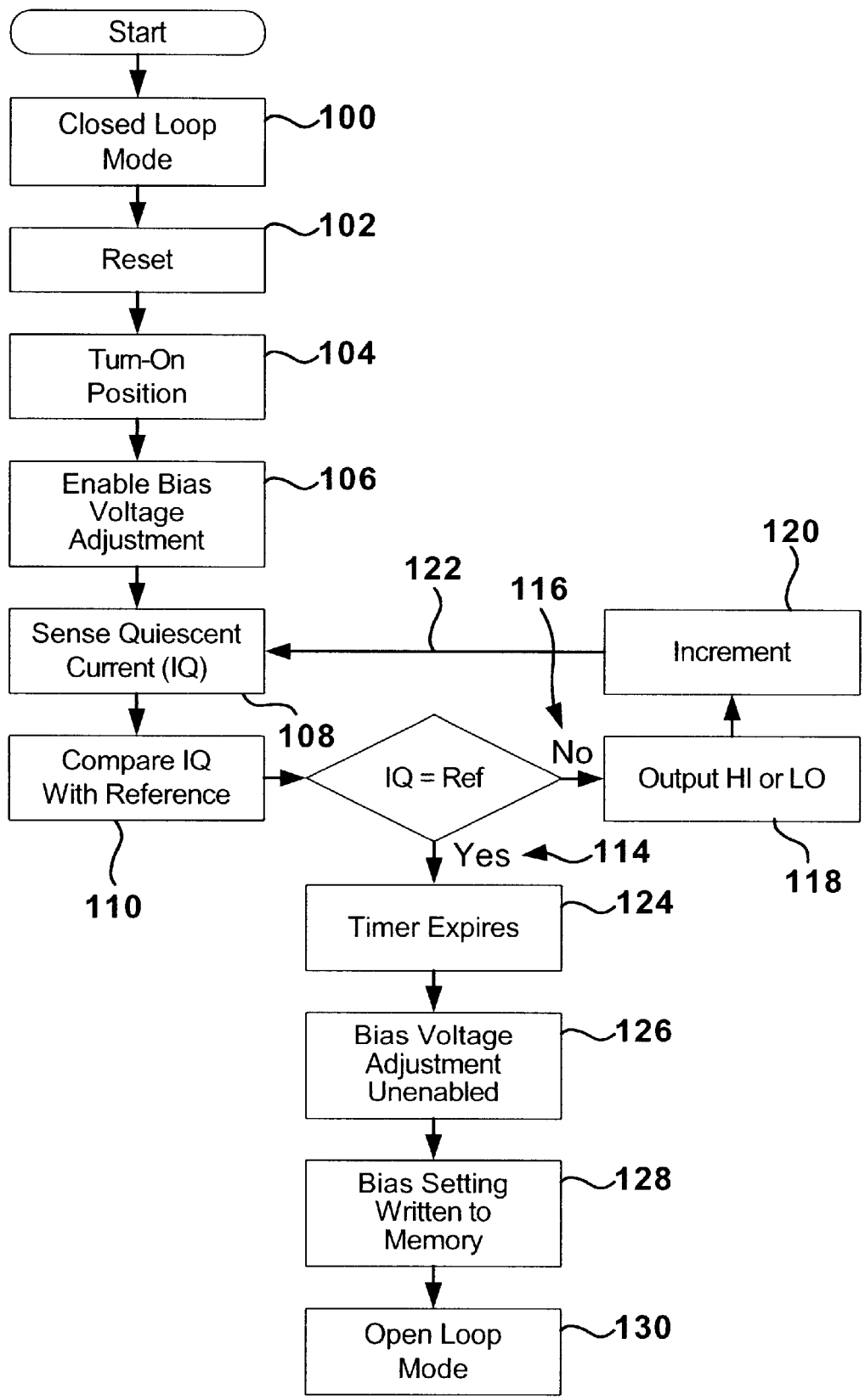
FIG. 11 is a process flow diagram showing an example of the steps of the methods of the invention.

A process flow diagram is provided in FIG. 11 for illustration in the steps of the methods of the invention. It should be understood that the example shown and described with respect to FIG. 11 corresponds with the examples of the LDMOS biasing circuit 12 shown in FIG. 1 and FIG. 9. At turn-on, the LDMOS device 10 is run in "Closed Loop" mode for biasing, at step 100, and the biasing circuit 12 is reset, step 102. The bias point is set to an initial turn-on position, preferably its mid-range value, step 104. Alternatively, a previously set bias point value may be retained in non-volatile memory for use at a subsequent turn-on. In step 106, bias point adjustment is enabled.

As shown in step 108, the current draw of the LDMOS device is sensed and, in step 110, is compared to a quiescent current reference. As indicated by decision diamond 112, the comparison step 110 can result in the detection of equality of the two currents, as indicated by path arrow 114, or inequality, as indicated by path arrow 116. In step 118, a logical high or low is produced corresponding with whether the LDMOS current is determined to be higher or lower than the reference current. In accordance with the logical high or low, the LDMOS gate bias is incremented at step 120. As shown by path arrow 122, steps 108 through 120 reiterate until the LDMOS current equals the reference current at decision diamond 112. Those skilled in the arts will recognize that the tolerances used for making the current comparison and determining equality may be varied according to the available components and accuracy requirements of the particular application of the invention.

When no difference is detected between the LDMOS current and the reference current, as indicated by path arrow 114, the method proceeds to step 124. At step 124, the timer expires with the currents equal, resulting the bias voltage adjustment being un-enabled, step 126. At step128 the present bias setting is stored, preferably in non-volatile memory. At step 130, the RF drive is allowed to come on such that the LDMOS device is able to operate in the "Class AB" mode.

While the LDMOS device runs in the "Open Loop" mode, thermal conditions at the LDMOS device are monitored. Thermal compensation is provided to the bias point setting continuously.

It should be understood that the setting of the bias point of the LDMOS device is preferably made to occur within approximately 100 milliseconds of turn-on. In contrast, the temperature correction step is performed continuously.

The embodiments shown and described above are only exemplary. Even though numerous characteristics and advantages of the present invention have been set forth in the foregoing description together with details of the invention, the disclosure is illustrative only and changes may be made within the principles of the invention to the full extent indicated by the broad general meaning of the terms used in the attached claims.

We claim:

1. A method for setting the bias point of an LDMOS device comprising the steps of:
    (a) sensing the current draw of an LDMOS device;
    (b) comparing the current draw of the LDMOS device to a reference;
    (c) incrementing a digital potentiometer in response to the comparison;
    (d) responsively applying a voltage to the gate of the LDMOS device to offset the difference detected in the comparing step;
    (e) repeating steps (a)–(d) until the gate voltage remains a substantially constant value; and
    (f) setting the bias point at the substantially constant value.

2. The method of claim 1 further comprising performing steps (a)–(f) each time power is cycled to the LDMOS.

3. The method of claim 1 further comprising the step of using a thermal reference to provide temperature correction to the bias point.

4. The method of claim 1 further comprising the step of storing the bias point in nonvolatile memory.

5. The method of claim 1 further comprising the step of operating the LDMOS device in class A amplifier mode during steps (a)–(f).

6. The method of claim 1 further comprising the step of operating the LDMOS device in class AB amplifier mode subsequent to step (f).

7. Simultaneously performing the method of claim 1 on a plurality of LDMOS devices connected in parallel.

8. A system for setting the bias point of an LDMOS device comprising:
    a current sensor operably coupled to sense the current draw of the LDMOS device;
    a comparator operatively coupled to the current sensor for comparing the current draw of the LDMOS device to a reference;
    a digital potentiometer operably coupled to the comparator for incrementing the gate bias of the LDMOS device in response to the comparator output; and
    a mechanism for storing the bias point of the LDMOS device such that the bias point remains set for operation of the LDMOS device.

9. The system of claim 8 further comprising a bias regulator operably coupled to the digital potentiometer and a thermal reference, the thermal reference in turn operably coupled to the LDMOS device and the bias regulator, for compensating the bias point in response to temperature changes.

10. The system of claim 8 further comprising an op-amp operably coupled to the digital potentiometer and a thermal reference, the thermal reference in turn operably coupled to the LDMOS device, for compensating the bias point in response to temperature changes.

11. The system of claim 8 adapted to automatically set the bias point each time power is cycled to the LDMOS device.

12. A system adapted for simultaneously setting the bias points of a plurality of electrically parallel LDMOS devices comprising a plurality of subsystems according to claim 8.

13. The system of claim 8 wherein the LDMOS device comprises a class AB RF power transistor.

14. A circuit for setting the bias point of one or more LDMOS device comprising:
- a current sensor operably coupled to sense the current draw of the LDMOS;
- a comparator operatively coupled to the current sensor for comparing the current draw of the LDMOS to a reference;
- a digital potentiometer having its wiper input operably coupled to the comparator and its wiper output operatively coupled to the LDMOS gate;
- a timer operatively coupled to a flip-flop;
- the flip-flop operatively coupled to enable/disable the digital potentiometer;
- a clock operatively coupled to activate the digital potentiometer; and
- a nonvolatile memory device for storing the bias point of the LDMOS such that the bias point remains set for operation of the LDMOS device.

15. The circuit of claim 14 wherein the LDMOS device comprises a class AB power transistor.

16. The circuit of claim 14 adapted to automatically set the bias point each time power is cycled to the LDMOS device.

17. The circuit of claim 14 further comprising a bias regulator operably coupled to the digital potentiometer and a thermal reference, the thermal reference in turn operably coupled to the LDMOS device, for compensating the bias point responsive to temperature changes.

18. The circuit of claim 14 further comprising an op amp operably coupled to the digital potentiometer and a thermal reference, the thermal reference in turn operably coupled to the LDMOS device, for compensating the bias point responsive to temperature changes.

* * * * *